United States Patent
Zhang et al.

(10) Patent No.: US 10,490,651 B2
(45) Date of Patent: Nov. 26, 2019

(54) SEMICONDUCTOR STRUCTURES AND FABRICATION METHODS THEREOF

(71) Applicants: Semiconductor Manufacturing International (Shanghai) Corporation, Shanghai (CN); Semiconductor Manufacturing International (Beijing) Corporation, Beijing (CN)

(72) Inventors: Chao Zhang, Shanghai (CN); Ru Ling Zhou, Shanghai (CN); Qing Yong Zhang, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 15/918,784

(22) Filed: Mar. 12, 2018

(65) Prior Publication Data

US 2018/0269303 A1 Sep. 20, 2018

(30) Foreign Application Priority Data

Mar. 16, 2017 (CN) .......................... 2017 1 0156416

(51) Int. Cl.
| | |
|---|---|
| *H01L 29/66* | (2006.01) |
| *H01L 29/78* | (2006.01) |
| *H01L 21/266* | (2006.01) |
| *H01L 21/265* | (2006.01) |
| *H01L 29/167* | (2006.01) |
| *H01L 21/225* | (2006.01) |
| *H01L 29/08* | (2006.01) |

(52) U.S. Cl.
CPC ...... *H01L 29/6659* (2013.01); *H01L 21/2253* (2013.01); *H01L 21/266* (2013.01); *H01L 29/0847* (2013.01); *H01L 29/167* (2013.01); *H01L 29/7835* (2013.01); *H01L 21/2652* (2013.01)

(58) Field of Classification Search
CPC ........................ H01L 29/7835; H01L 29/167
See application file for complete search history.

(56) References Cited

U.S. PATENT DOCUMENTS 5,903,029 A * 5/1999 Hayashida .......... H01L 29/0847
257/344
6,162,668 A * 12/2000 Oda .................. H01L 21/28512
438/197

(Continued)

*Primary Examiner* — Victoria K. Hall
(74) *Attorney, Agent, or Firm* — Anova Law Group, PLLC

(57) ABSTRACT

A method for fabricating a semiconductor structure is disclosed. The method includes providing a substrate and forming a plurality of fin structures on the substrate. Each fin structure includes a first side and a second side opposite to the first side. The method further includes forming a first doped region containing first doping ions in a portion of the substrate on the first side of each gate structure, and forming a second doped region containing second doping ions in a portion of the substrate on the second side of each gate structure. The ion concentration of the second doping ions in the second doped region is smaller than the ion concentration of the first doping ions in the first doped region, and the atomic weight of the second doping ions is smaller than the atomic weight of the first doping ions.

20 Claims, 4 Drawing Sheets

(56) References Cited

U.S. PATENT DOCUMENTS

| | | | | |
|---|---|---|---|---|
| 6,287,917 B1* | 9/2001 | Park | H01L 27/115 | 257/E21.679 |
| 6,337,249 B1* | 1/2002 | Yamane | H01L 27/088 | 257/E21.427 |
| 6,362,501 B1* | 3/2002 | Kim | H01L 27/10805 | 257/296 |
| 7,019,363 B1* | 3/2006 | Yu | H01L 21/26513 | 257/344 |
| 7,736,983 B2* | 6/2010 | Kohli | H01L 21/26506 | 438/303 |
| 7,973,372 B2* | 7/2011 | Bahl | H01L 21/2658 | 257/408 |
| 10,361,305 B2* | 7/2019 | Zhou | H01L 21/823878 | |
| 10,367,058 B2* | 7/2019 | Zhou | H01L 21/823431 | |
| 10,373,880 B2* | 8/2019 | Xiao | H01L 21/8252 | |
| 10,396,174 B2* | 8/2019 | Zhou | H01L 29/6609 | |
| 2001/0034095 A1* | 10/2001 | Matsuda | H01L 21/823807 | 438/231 |
| 2002/0125510 A1* | 9/2002 | Ohyanagi | H01L 21/823412 | 257/288 |
| 2004/0063264 A1* | 4/2004 | Zheng | H01L 21/823814 | 438/199 |
| 2004/0180504 A1* | 9/2004 | Lee | H01L 21/82345 | 438/303 |
| 2006/0040450 A1* | 2/2006 | Hsu | H01L 21/26586 | 438/305 |
| 2007/0075354 A1* | 4/2007 | Ono | H01L 27/115 | 257/315 |
| 2008/0124864 A1* | 5/2008 | Wang | H01L 21/26513 | 438/256 |
| 2010/0244128 A1* | 9/2010 | Bulucea | H01L 21/26513 | 257/335 |
| 2010/0270609 A1* | 10/2010 | Olsen | C23C 16/345 | 257/324 |
| 2011/0133189 A1* | 6/2011 | Yang | H01L 29/165 | 257/57 |

* cited by examiner

SEMICONDUCTOR STRUCTURES AND FABRICATION METHODS THEREOF

CROSS-REFERENCES TO RELATED APPLICATIONS

This application claims the priority of Chinese Patent Application No. CN201710156416.6, filed on Mar. 16, 2017, the entire content of which is incorporated herein by reference.

FIELD OF THE DISCLOSURE

The present disclosure generally relates to the field of semiconductor fabrication technology and, more particularly, relates to semiconductor structures and fabrication methods thereof.

BACKGROUND

With the continuous development of semiconductor technology, semiconductor devices have been more and more widely used, and the requirements on the performance of semiconductor devices have also become higher and higher.

Transistor with a metal-oxide-semiconductor (MOS) structure is known as a MOS transistor. As a basic semiconductor device, the MOS transistor demonstrates many advantages such as simple drive circuit, small required drive power, fast switch speed, and high operation frequency. Therefore, the MOS transistor has been widely used as switch devices in various circuits, including radio-frequency (RF) circuits, etc.

In the field of electronic technology, the characteristics of RF circuits are different from the characteristics of the conventional low-frequency circuits. This is mainly because that the circuit characteristics under high frequency conditions are different from the circuit characteristics under low frequency conditions. Specifically, under high frequency conditions, stray capacitance and stray inductance have significant impact on the circuits.

Stray inductance in a semiconductor device includes inductance at the wire connections and internal self-inductance of the components. Stray capacitance in a semiconductor device includes capacitance between the conductors of the circuits and also between the components and the ground. For example, the overlapping capacitance between the gate electrode and the source/drain extension region is in the stray capacitance category. Further, the on resistance of RF circuits may have important influence on the energy consumption of the RF circuits, and thus may affect the signal strength of the RF circuits.

However, MOS switches formed by conventional methods have several disadvantages such as large on resistance ($R_{ON}$), large overlapping capacitance ($C_{OV}$), etc., and such disadvantages may result in large switch signal loss and lead to undesired performance of the MOS switches. The disclosed semiconductor devices and fabrication methods thereof are directed to solve one or more problems set forth above and other problems in the art.

BRIEF SUMMARY OF THE DISCLOSURE

One aspect of the present disclosure provides a method for fabricating a semiconductor structure. The method includes providing a substrate and forming a plurality of fin structures on the substrate. Each fin structure includes a first side and a second side opposite to the first side. The method further includes forming a first doped region containing first doping ions in a portion of the substrate on the first side of each gate structure, and forming a second doped region containing second doping ions in a portion of the substrate on the second side of each gate structure. The ion concentration of the second doping ions in the second doped region is smaller than the ion concentration of the first doping ions in the first doped region, and the atomic weight of the second doping ions is smaller than the atomic weight of the first doping ions.

Another aspect of the present disclosure provides a semiconductor structure. The semiconductor structure includes a substrate and a plurality of fin structures formed on the substrate. Each fin structure includes a first side and a second side opposite to the first side. The semiconductor structure also includes a first doped region containing first doping ions in a portion of the substrate on the first side of each gate structure, and a second doped region containing second doping ions in a portion of the substrate on the second side of each gate structure. The ion concentration of the second doping ions in the second doped region is smaller than the ion concentration of the first doping ions in the first doped region, and the atomic weight of the second doping ions is smaller than the atomic weight of the first doping ions.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
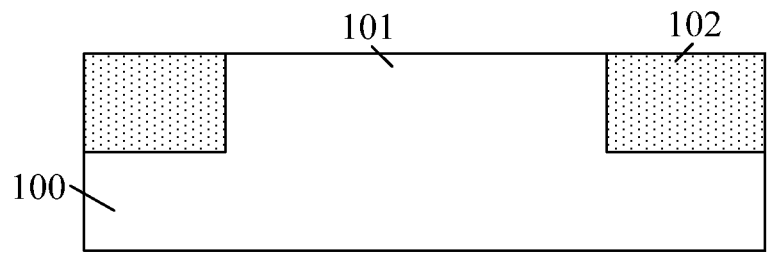
FIGS. 1-8 illustrate schematic views of semiconductor structures at certain stages of an exemplary method for fabricating a semiconductor structure consistent with various embodiments of the present disclosure.

Reference will now be made in detail to exemplary embodiments of the invention, which are illustrated in the accompanying drawings. Wherever possible, the same reference numbers will be used throughout the drawings to refer to the same or like parts.

The MOS switch includes a substrate, a gate structure formed on the substrate, a source extension region and a drain extension region. The source extension region and the drain extension region are formed in the substrate on the two opposite sides of the gate structure. The doping ions in the source extension region have a same atomic weight and a same concentration as the doping ions in the drain extension region.

Moreover, during the process to form the source extension region and the drain extension region, the source extension region and the drain extension region are formed by a same process in order to simplify the fabrication process. Therefore, the atomic weight and the ion concentration of the doping ions in the source extension region may be the same as the atomic weight and the ion concentration of the doping ions in the drain extension region, respectively.

Because the source extension region and the drain extension region have an identical ion concentration of the doping ions, when the ion concentration of the doping ions in the source extension region is large, the ion concentration of the doping ions in the drain extension region is also large; when the ion concentration of the doping ions in the source extension region is small, the ion concentration of the doping ions in the drain extension region is also small.

Further, when the ion concentration of the doping ions in the source extension region and the drain extension region is small, the on resistance of the formed MOS switch may be large, and accordingly, the signal loss may also be large. When the ion concentration of the doping ions in the source extension region and the drain extension region is large, the number of the doping ions diffused into the MOS switch channel may also be large, and thus the source extension region and the drain extension region may both have a relatively large area. Therefore, the contact areas between the source extension region and the gate structure and between the drain extension region and the gate structure may be overly large, leading to large overlapping capacitance and causing signal leaking. As such, the formed MOS switch may face the source-drain punch-through issue.

The overlapping capacitance is related to the atomic weight of the doping ions in the source extension region and the drain extension region. When the atomic weight of the doping ions in the source extension region and the drain extension region is relatively small, the doping ions in the source extension region and the drain extension region may be able to diffuse easily. The diffusion of the doping ions may likely lead to relatively large contact areas between the source extension region and the gate structure and also between the source extension region and the gate structure. As such, the overlapping capacitance between the source extension region and the gate structure and between the drain extension region and the gate structure may be relatively large. Further, when the formed MOS switch is in an 'off' state and the drain extension region is connected to a high-frequency alternating current (AC) signal, the signal may still be able to pass the MOS switch, causing signal leakage.

According to a method to reduce the overlapping capacitance, the atomic weight of the doping ions in the source extension region and the drain extension region may be increased. However, when the atomic weight of the doping ions in the source extension region and the atomic weight of the doping ions in the drain extension region are increased simultaneously, the doping ions in both the source extension region and the drain extension region may not be able to diffuse easily. Therefore, the depth of the source extension region and the depth of the drain extension region may be small, which may lead to an increase in the on resistance of the MOS switch.

Figure 8:
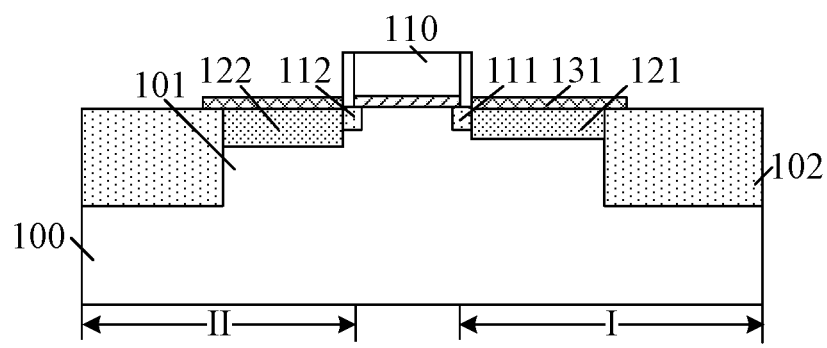
Figure 9:
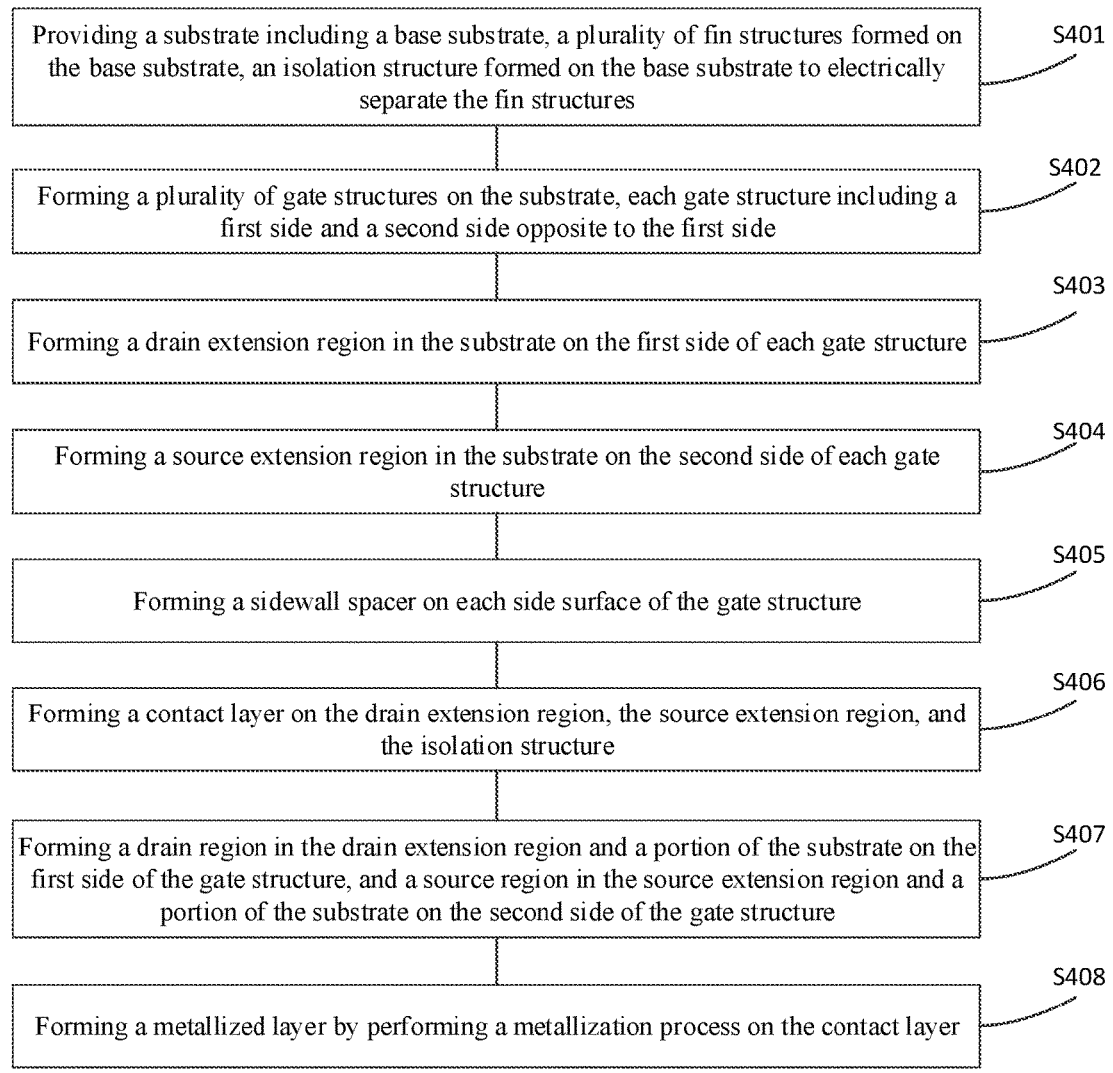
FIG. 9 illustrates a flowchart of an exemplary method for fabricating a semiconductor structure consistent with various embodiments of the present disclosure.

The present disclosure provides a semiconductor structure and a method for fabricating the semiconductor structure. FIG. 9 shows a flowchart of an exemplary method for fabricating a semiconductor structure consistent with various embodiments of the present disclosure. FIGS. 1-8 illustrate schematic views of semiconductor structures at certain stages of the exemplary fabrication method.

Referring to FIG. 9, at the beginning of the fabrication process, a substrate may be provided (S401). FIG. 1 shows a schematic cross-section view of a semiconductor structure consistent with various embodiments of the present disclosure.

Referring to FIG. 1, a substrate may be provided. In one embodiment, the substrate may include a base substrate 100 and a plurality of fin structures 101. In other embodiments, the substrate may be a planar substrate.

In one embodiment, the substrate may be formed by a process including the following steps. First, an initial substrate may be provided. The initial substrate may then be patterned to form the base substrate 100 and the plurality of fin structures 101.

In one embodiment, the substrate may be used to form a plurality of N-type metal-oxide-semiconductor (NMOS) transistors. In other embodiments, the substrate may be used to form a plurality of P-type metal-oxide-semiconductor (PMOS) transistors, or form a plurality of transistors including both NMOS transistors and PMOS transistors.

Moreover, although the substrate may include a plurality of fin structures 101, only one fin structure 101 is shown in FIG. 1 to illustrate the process for fabricating the semiconductor structure consistent with various embodiments of the present disclosure. The fin structure 101 shown in FIG. 1 may be used to form an NMOS transistor or a PMOS transistor.

In one embodiment, the fabrication method may also include forming an isolation structure 102 on the base substrate. The isolation structure 102 may expose the top surface of the fin structure 101. The isolation structure 102 may be used to electrically isolate the plurality of fin structures 101.

In one embodiment, an opening may be formed in the fin structure 101. The isolation structure 102 may also be formed in the opening. The surface of the portion of the isolation structure 102 formed in the opening may be leveled with the top surface of the fin structure 101. In other embodiments, the surface of the isolation structure may be lower than the top surface of the fin structure.

In one embodiment, the isolation structure 102 may be made of $SiO_x$. In other embodiments, the isolation structure may be made of SiON, or any other appropriate insulating material.

In one embodiment, the fabrication method may also include performing an ion implantation process on the substrate to implant adjustment ions into the substrate. The adjustment ions may be used to adjust the threshold voltage of the subsequently formed transistor.

In one embodiment, the substrate is used to form an NMOS transistor, and accordingly, the adjustment ions may be P-type ions, such as boron ions, $BF_2^+$ ions, etc. In other embodiments, the substrate may be used to form a PMOS transistor, and accordingly, the adjustment ions may be N-type ions, such as phosphorus ions, arsenic ions, etc.

Figure 2:
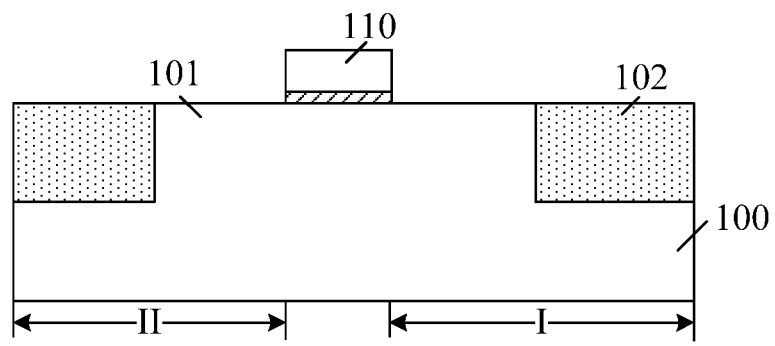

Further, returning to FIG. 9, a gate structure may be formed on the substrate (S402). FIG. 2 shows a schematic cross-section view of a semiconductor structure consistent with various embodiments of the present disclosure.

Referring to FIG. 2, a gate structure 110 may be formed on the substrate. The gate structure 110 may include a first side I and a second side II. The first side I and the second side II may be opposite to each other.

In one embodiment, the gate structure 110 may be formed across the fin structure 101 and may cover a portion of the sidewall and the top surfaces of the fin structure 101. Moreover, the gate structure 110 may include a gate dielectric layer formed across the fin structure 101 to cover the portion of the sidewall and the top surfaces of the fin structure 101, and a gate electrode formed on the gate dielectric layer. In one embodiment, the gate dielectric layer may be made of $SiO_x$, and the gate electrode may be made of polycrystalline silicon.

Returning to FIG. 9, a drain extension region may be formed in the portion of the substrate on the first side of the gate structure through a lightly drain-doping process (S403).

Figure 3:
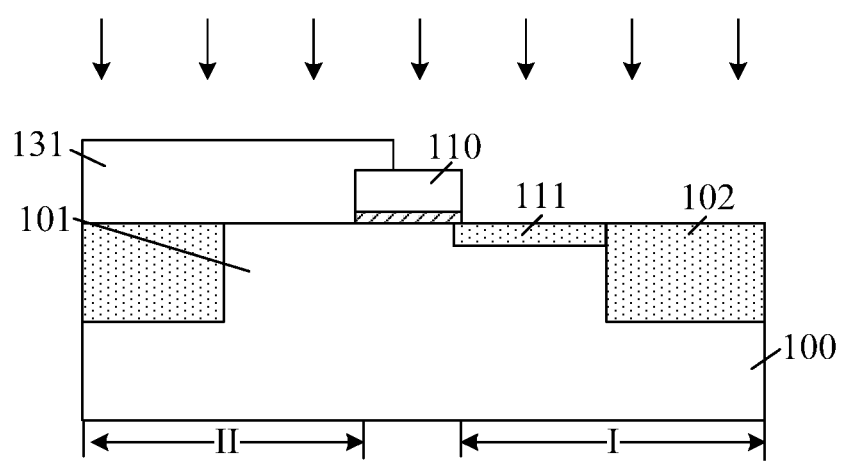

FIG. 3 illustrates a semiconductor structure consistent with various embodiments of the present disclosure.

Referring to FIG. 3, a drain extension region 111 may be formed in the portion of the substrate on the first side I of the gate structure 110 through a lightly drain-doping process. The drain extension region 111 may be used to provide a gradient in the atomic doping concentration between the gate structure 110 and a subsequently-formed drain region, and thus reduce the resistance between the gate structure and the drain region. That is, the drain extension region 111 may have an atomic doping concentration smaller than the atomic doping concentration of a subsequently-formed drain region so that the resistance between the gate structure and the drain region may be reduced.

In one embodiment, the doping ions used in the lightly drain-doping process may be first doping ions. Therefore, the formed drain extension region 111 may contain first doping ions.

In one embodiment, the atomic weight of the first doping ions may be relatively large so that the first doping ions may not be able to diffuse easily. Therefore, the number of first doping ions diffused into the channel of the formed transistor may be reduced. As such, the SCE may be suppressed and the source-drain punching through may be avoided. In the meantime, because diffusion of the first doping ions is weak, the contact area between the first doped region 111 and the gate structure 110 may be small. Therefore, the overlapping capacitance between the first doped region 111 and the gate structure 110 may be reduced, and thus the leakage current may also be reduced. As such, the performance of the formed semiconductor structure may be improved.

Moreover, in one embodiment, the ion concentration of the first doping ions in the drain extension region 111 may be large. A large ion concentration of the first doping ions in the drain extension region 111 may be conducive to reducing the electric field between the subsequently-formed drain region and the channel. Therefore, the on resistance of the formed NMOS transistor may be reduced, and the energy consumption may also be reduced.

In one embodiment, the process to form the drain extension region 111 may include the following steps. First, a first patterned layer 131 may be formed on the portion of the substrate on the second side II of the gate structure 110. The first patterned layer 131 may expose the portion of the substrate on the first side I of the gate structure 110. Further, the first doping ions are implanted into the substrate using the first patterned layer 131 as a mask. As such, the portion of the substrate on the first side I of the gate structure 110 may be doped with the first doping ions and thus form the drain extension region 111.

In one embodiment, the first patterned layer 131 may be made of a photoresist material.

In one embodiment, to form an NMOS transistor, the first doping ions are arsenic ions. In other embodiments, to form an NMOS transistor, the first doping ions may be antimony ions, alternatively, to form a PMOS transistor, the first doping ions may be indium ions and/or thallium ions.

When the implantation dose of the first doping ions is too small, the ion concentration of the first doping ions in the drain extension region 111 may also be too small. An undesirably small ion concentration of the first doping ions in the drain extension region 111 may not be able to effectively reduce the on resistance of the formed NMOS transistor, and thus the energy consumption may not be reduced. Therefore, the implantation dose of the first doping ions may not be too low. Moreover, when the implantation dose of the first doping ions is too large, the ion concentration of the first doping ions in the drain extension region 111 may also be undesirably large, which may not be conducive to suppressing the SCE. In one embodiment, the implantation dose of the first doping ions may be in a range of approximately 1E15 atoms/cm$^2$ to 5E15 atoms/cm$^2$.

Further, when the implantation energy of the first doping ions is too high, the fin structure 101 may be damaged easily, thus affecting the performance of the formed MOS transistor. Moreover, when the implantation energy of the first doping ions is too low, implanting the first doping ions may be more difficult to process. Therefore, in one embodiment, the implantation energy of the first doping ions may be in a range of approximately 3 keV to 5 keV.

Figure 4:
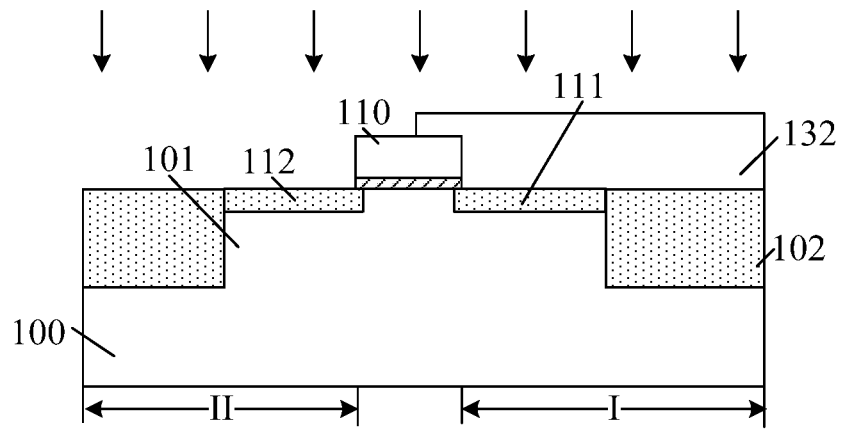

Further, returning to FIG. 9, a source extension region may be formed in the portion of the substrate on the portion of the second side of the gate structure through a lightly source-doping process (S404). FIG. 4 shows a schematic cross-section view of a semiconductor structure consistent with various embodiments of the present disclosure.

Referring to FIG. 4, a source extension region 112 may be formed in the portion of the substrate on the second side II of the gate structure 110 through a lightly source-doping process. The source extension region 112 may be used to provide a gradient in the doping concentration between the gate structure 110 and a subsequently-formed source region, and thus reduce the resistance between the gate structure and the source region. That is, the source extension region 112 may have an atomic doping concentration smaller than the atomic doping concentration of a subsequently-formed source region so that the resistance between the gate structure and the source region may be reduced.

In one embodiment, the doping ions used in the lightly source-doping process may be second doping ions. Therefore, the formed source extension region 112 may contain second doping ions. Moreover, the atomic weight of the second doping ions may be smaller than the atomic weight of the first doping ions.

In one embodiment, the atomic weight of the second doping ions may be relatively small so that the second doping ions may be able to diffuse easily. Therefore, the depth of the formed source extension region 112 may be large, and thus the on resistance of the formed NMOS transistor may be reduced.

Further, the ion concentration of the second doping ions in the source extension region 112 may be relatively small as compared to the ion concentration of the first doping ions in the drain extension region 111. When the ion concentration of the source extension region 112 is low, the number of the second doping ions diffused into the channel of the formed NMOS transistor may be small. As such, the SCE may be suppressed. In one embodiment, the ion concentration of the second doping ions in the source extension region 112 may be in a range of approximately 1E13 atoms/cm$^2$ to 1E15 atoms/cm$^2$.

In one embodiment, the process to form the source extension region 112 may include the following steps. First, a second patterned layer 132 may be formed on the portion of the substrate on the first side I of the gate structure 110. The second patterned layer 132 may expose the portion of the substrate on the second side II of the gate structure 110. Further, the second doping ions are implanted into the substrate using the second patterned layer 132 as a mask. As such, the portion of the substrate on the second side II of the gate structure 110 may be doped with the second doping ions and thus form the source extension region 112.

In one embodiment, the second patterned layer 132 may be made of a photoresist material.

In one embodiment, to form an NMOS transistor, the first doping ions are arsenic ions, and the second doping ions are phosphorus ions. In other embodiments, to form a PMOS transistor, the first doping ions may be indium ions and/or thallium ions, and the second doping ions may be boron ions and/or $BF_2^+$ ions.

When the implantation dose of the second doping ions is too small, the ion concentration of the second doping ions in the source extension region 112 may also be too small. An undesirably small ion concentration of the second doping ions in the source extension region 112 may not be able to effectively reduce the on resistance of the formed NMOS transistor, and thus the energy consumption may not be reduced. Therefore, the implantation dose of the second doping ions may not be too small. Moreover, when the implantation dose of the second doping ions is too large, the ion concentration of the second doping ions in the source extension region 112 may also be undesirably large, which may not be conducive to suppressing the SCE. In one embodiment, the implantation dose of the second doping ions may be in a range of approximately 1E13 atoms/cm² to 1E15 atoms/cm². An implantation dose of the second doping ions in the above range may unlikely cause the ion concentration of the second doping ions in the source extension region 112 to be overly large. As such, the SCE may be suppressed. In the meantime, the implantation dose of the second doping ions in the above range may not lead to an undesirably small ion concentration of the second doping ions in the source extension region 112, and thus the on resistance of the formed NMOS transistor may be reduced.

Further, when the implantation energy of the second doping ions is too high, the fin structure 101 may be damaged easily, and thus the performance of the formed MOS transistor may be degraded. Moreover, when the implantation energy of the second doping ions is too low, implanting the second doping ions may be more difficult to process. In one embodiment, the implantation energy of the second doping ions may be in a range of approximately 10 keV to 30 keV. An implantation energy of the second doping ions in the above range may help increase the depth of the formed source extension region 112, and thus the on resistance of the formed NMOS transistor may be reduced. In the meantime, the implantation energy of the second doping ions may also be able to reduce the energy consumption during the process to implant the second doping ions.

Figure 7:
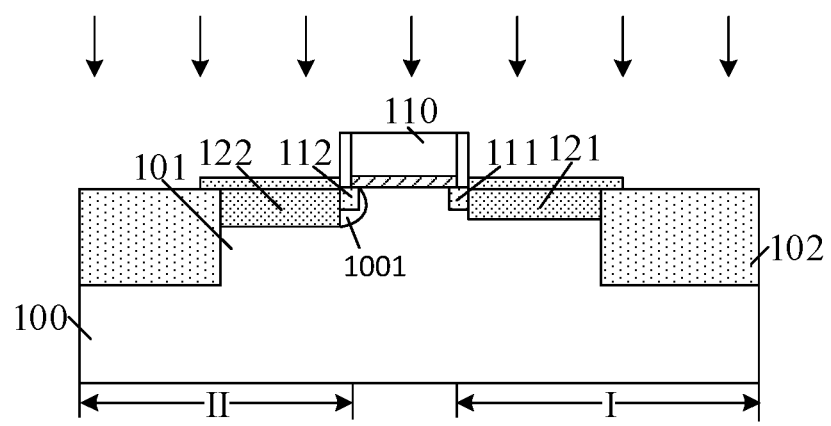

Moreover, prior to forming a source region, the fabrication method may also include forming a halo region 1001 (as shown in FIG. 7) in the portion of the substrate on the second side II of the gate structure 110. The halo region may be formed to block the diffusion of the second doping ions into the channel of the formed NMOS transistor, and thus in the formed NMOS transistor, the SCE may be suppressed.

In one embodiment, the halo region may be formed by implanting halo-region doping ions into the portion of the substrate on the second side II of the gate structure 110. The doping type of the halo-region doping ions may be opposite to the doping type of the second doping ions.

The halo-region doping ions may be able to recombine with the second doping ions, thus preventing the second doping ions from diffusing into the channel of the subsequently-formed NMOS transistor. As such, the SCE may be suppressed.

In one embodiment, the atomic weight of the second doping ions in the source extension region 112 is relatively small, and the second doping ions may thus be able to diffuse easily. Implanting halo-region doping ions into the portion of the substrate on the second side II of the gate structure 110 may be able to reduce the number of the second doping ions diffused into the NMOS transistor. As such, the SCE may be suppressed. Moreover, the atomic weight of the first doping ions in the drain extension region 111 is relatively large, and thus the first doping ions may be less diffusible. Therefore, it is not necessary to further implant the halo-region doping ions into the portion of the substrate on the first side I of the gate structure 110 to reduce the diffusion effect of the first doping ions. Moreover, because the halo-region doping ions are not implanted into the portion of the substrate on the first side I of the gate structure 110, an increase in the on resistance of the formed NMOS transistor due to implanting the halo-region doping ions may also be avoided.

In one embodiment, the halo-region doping ions and the second doping ions may be implanted by a same process. That is, the halo-region doping ions and the second doping ions may be implanted simultaneously. In other embodiment, the halo-region doping ions and the second doping ions may be implanted separately by different ion implantation processes. Specifically, the halo-region doping ions may be implanted before or after the second doping ions are implanted.

In one embodiment, the second patterned layer 132 may be used as a mask during the implantation of the halo-region doping ions.

In one embodiment, the first doping ions are N-type ions, and accordingly, the halo-region doping ions are P-type ions, such as boron ions and $BF_2^+$ ions. In other embodiments, the first doping ions may be P-type ions, and accordingly, the halo-region doping ions may be N-type ions.

When the implantation dose of the halo-region doping ions is too small, the ion concentration of the halo-region doping ions in the formed halo region may be too small to prevent the second doping ions from diffusing into the channel of the subsequently-formed transistor, and thus the SCE may not be effectively suppressed. Therefore, the implantation dose of the halo-region doping ions may not be too small. In addition, when the implantation dose of the halo-region doping ions is too large, the ion concentration of the halo-region doping ions in the halo region may be overly large, which may easily cause an increase in the on resistance of the formed NMOS transistor.

Specifically, in one embodiment, process parameters adapted for implanting the halo-region doping ions may include an implantation dose in a range of approximately 5E12 atoms/cm² to 1.5E13 atoms/cm², and an implantation energy in a range of approximately 18 keV to 22 keV.

In one embodiment, after forming the source extension region 111, the source extension region 112 may then be formed. In other embodiments, the source extension region may be formed prior to forming the drain extension region.

In one embodiment, after forming the source extension region 112 and the drain extension region 111, the fabrication method may also include performing a first annealing process on the source extension region 112 and the drain extension region 111.

The first annealing process may be performed to activate the first doping ions and the second doping ions. The first annealing process may be a rapid thermal annealing (RTA) process.

Figure 5:
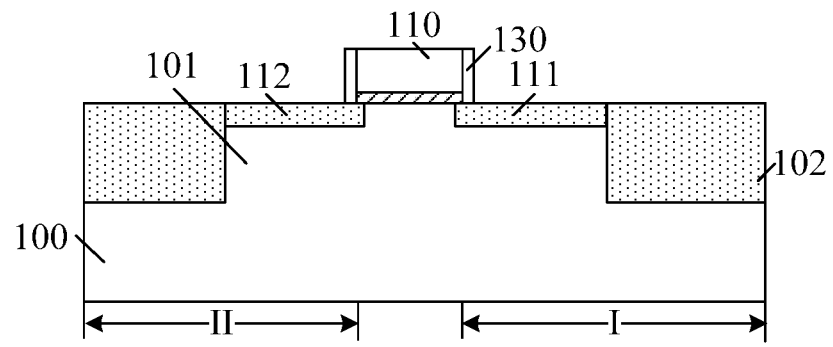

Further, returning to FIG. 9, after forming the source extension region and the drain extension region, a sidewall spacer may be formed on each side surface of the gate structure (S405). FIG. 5 shows a schematic cross-section view of a semiconductor structure consistent with various embodiments of the present disclosure.

Referring to FIG. 5, after forming the source extension region 112 and the drain extension region 111, a sidewall spacer 130 may be formed on each of the two side surfaces of the gate structure 110. That is, two sidewall spacers 130 may be formed corresponding to the gate structure 110. In one embodiment, the sidewall spacer 130 may be made of $SiN_x$. In other embodiments, the sidewall spacer may be made of $SiO_x$, or any other appropriate material.

The sidewall spacers 130 may be formed to define the positions for the source region and the drain region formed subsequently. Specifically, after forming the sidewall spacers 130 on the side surfaces of the gate structure 110, in a subsequent process, a drain region may be formed in the drain extension region 111 and the portion of the substrate on the first side I of the gate structure 110 and a source region may be formed in the source extension region 112 and the portion of the substrate on the second side II of the gate structure 110. Therefore, the sidewall spacers 130 may define the distance from the subsequently-formed source region to the gate structure 110 and the distance from the subsequently-formed drain region to the gate structure 110.

Figure 6:
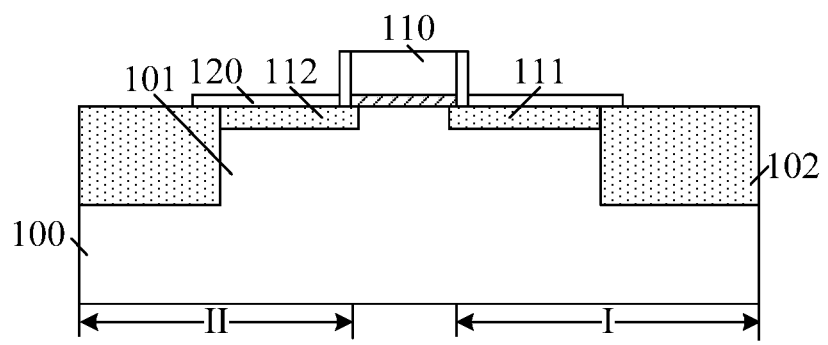

Returning to FIG. 9, further, a contact layer may be formed on the drain extension region, the source extension region, and a portion of the isolation structure (S406). FIG. 6 shows a schematic cross-section view of a semiconductor structure consistent with various embodiments of the present disclosure.

Referring to FIG. 6, a contact layer 120 may be formed on the drain extension region 111, the source extension region 112, and a portion of the isolation structure 102. The contact layer 120 may be used to form a metallized layer in a subsequent process in order to reduce the contact resistance between a subsequently-formed source region and a corresponding contact plug and also reduce the contact resistance between a subsequently-formed drain region and a corresponding contact plug.

In order to improve the integration level of the formed semiconductor structure, the surface areas of the source extension region 112, the drain extension region 111, the source region, and the drain region may need to be small. In a subsequent process to form contact plugs for the semiconductor structure, the alignment between the source region and the corresponding contact plug and the alignment between the drain region and the corresponding contact plug may be difficult to achieve. Therefore, the fabrication process may become more difficult. In one embodiment, in order to reduce the challenge in the fabrication process, a contact layer may be formed.

Referring to FIG. 6, the contact layer 120 may be formed on the source extension region 112, the drain extension region 111, and the portion of the isolation structure surrounding the source extension region 112 and the drain extension region 111.

In one embodiment, the process to form the contact layer 120 may include a furnace tube process. The contact layer 120 may be made of polycrystalline silicon, in other embodiments, the contact layer may be made of polycrystalline germanium or polycrystalline SiGe.

Further, returning to FIG. 9, a drain region may be formed in the drain extension region and a portion of the substrate through a drain doping process and a source region may be formed in the source extension region and a portion of the substrate through a source doping process (S407). FIG. 7 shows a schematic cross-section view of a semiconductor structure consistent with various embodiments of the present disclosure.

Referring to FIG. 7, a drain region 121 may be formed in the drain extension region 111 and a portion of the substrate 100 through a drain doping process. In addition, a source region 122 may be formed in the source extension region 112 and a portion of the substrate 100 through a source doping process.

In one embodiment, the distance from the drain region 121 to the center line of the gate structure 110 along the direction of the channel may be larger than the distance from the drain extension region 111 to the center line of the gate structure 110 along the direction of the channel. Moreover, the distance from the source region 122 to the center line of the gate structure 110 along the direction of the channel may be larger than the distance from the source extension region 112 to the center line of the gate structure 110 along the direction of the channel.

In one embodiment, the gate structure 110 and the sidewall spacers 130 may together be used as a mask to perform a source ion implantation process and/or a drain ion implantation process. Specifically, a source region 122 may be formed in the portion of the substrate and the source extension region 112 on the second side II of the gate structure 110 after performing the source ion implantation process, and a drain region 121 may be formed in the portion of the substrate and the drain extension region 111 on the first side I of the gate structure 110 after performing the drain ion implantation process.

In one embodiment, the doping ions used in the drain ion implantation process may be drain doping ions and the doping ions used in the source ion implantation process may be source doping ions. In other embodiments, the doping ions used in the drain ion implantation process may be the first doping ions, and the doping ions used in the source ion implantation process may be the second doping ions.

In one embodiment, the source doping ions may be the same as the drain doping ions, and the concentration of the source doping ions may also be the same as the concentration of the drain doping ions. In other embodiments, the concentration of the source doping ions may be different from the concentration of the drain doping ions, and/or the source doping ions may be different from the drain doping ions. For example, the drain doping ions may be the same as the first doping ions, the source doping ions may be the same as the second doping ions, and the concentration of the drain doping ions may be larger than the concentration of the source doping ions.

In one embodiment, the doping type of the drain doping ions may be the same as the doping type of the first doping ions, and the doping type of the source doping ions may be the same as the doping type of the second doping ions.

In one embodiment, the source region 122 and the drain regions 121 may be used to form an NMOS transistor, and accordingly, the source doping ions and the drain doping ions may be phosphorus ions, arsenic ions, or antimony ions. In other embodiments, the source region and the drain region may be used to form a PMOS transistor, and accordingly, the source region and the drain region may be boron ions and/or $BF_2^+$ ions.

In one embodiment, the doping ions used in the lightly drain-doping process to form the drain extension region are first doping ions, and the doping ions used in the lightly source-doping process to form the source extension region are second doping ions. In other embodiments, the doping ions used in the lightly source-doping process may be the same as the doping ions used in the lightly drain-doping process, and the ion concentration of the doping ions used in the lightly source-doping process may also be the same as the ion concentration of the doping ions used in the lightly drain-doping process.

Further, in one embodiment, the doping ions used in the drain doping process to form the drain region may be first doping ions, and the doping ions used in the source doping process to form the source region may be second doping ions. In addition, the ion concentration of the second doping ions may be smaller than the ion concentration of the first doping ions, and the atomic weight of the second doping ions may be smaller than the atomic weight of the first doping ions.

In one embodiment, after forming the source region 122 and the drain region 121, the fabrication method may also include performing a second annealing process on the source region 122 and the drain region 121.

The second annealing process may be performed to activate the source doping ions and the drain doping ions. The second annealing process may be an RTA process.

Moreover, during the process to implant the source doping ions and the drain doping ions, the source doping ions and the drain doping ions may also be implanted into the contact layer 120 (referring to FIG. 6). Therefore, the resistance of the contact layer 120 may be reduced, which may help improve the performance of the formed semiconductor structure.

Further, returning to FIG. 9, a metallization process may be performed on the contact layer to form a metallized layer (S408). FIG. 8 shows a schematic cross-section view of a semiconductor structure consistent with various embodiments of the present disclosure.

Referring to FIG. 8, after performing the second annealing process on the source region and the drain region, a metallization process may be performed on the contact layer 120 (referring to FIG. 6) to form a metallized layer 131.

In a subsequent process, contact plugs may be formed on the metallized layer 131. The metallization process may ensure the formation of ohmic contacts between the contact plugs and the metallized layer 131 formed from the contact layer 120 so that the contact resistance between each contact plug and the metallized layer 131 may be reduced. As such, the performance of the semiconductor structure may be improved.

In one embodiment, the metallized layer may be formed by a process including the following steps. First, a metal layer may be formed on the surfaces of the contact layer 131, the gate structure 110, and the isolation structure 102. The contact layer 120 (referring to FIG. 6) may then react with the metal layer and form the metallized layer 120. Further, the metal layer formed on the gate structure 110 and the isolation structure 102 may be removed.

In one embodiment, the metal layer may be made of nickel, and accordingly, the metallized layer 131 may be made of $SiNi_x$.

In one embodiment, after forming the metallized layer 131, the fabrication method may further include forming a plurality of contact plugs on the metallized layer 131.

According to the disclosed method for fabricating semiconductor structures, the ion concentration of the first doping ions is larger than the ion concentration of the second doping ions, and the atomic weight of the first doping ions is also larger than the atomic weight of the second doping ions. With the ion concentration of the first doping ions larger than the ion concentration of the second doping ions, the on resistance of the formed semiconductor structure may be reduced. In addition, with the atomic weight of the first doping ions relatively large, the first doping ions may not be able to diffuse easily. Therefore, the number of first doping ions diffused into the channel of the formed transistor may be reduced. As such, the SCE may be suppressed and the source-drain punching through may be avoided. In the meantime, because diffusion of the first doping ions is weak, the contact area between the first doped region and the gate structure may be small. Therefore, the overlapping capacitance between the first doped region and the gate structure may be reduced, and thus the leakage current may also be reduced. As such, the performance of the formed semiconductor structure may be improved.

Further, prior to forming the source region, a halo region is formed in the substrate on the second side of the gate structure. The halo-region doping ions are able to recombine with the second doping ions, thus preventing the second doping ions from diffusing into the channel of the formed transistor. Therefore, the leakage current may be reduced, and the performance of the formed semiconductor structure may be improved.

The present disclosure also provides a semiconductor structure. FIG. 8 shows a schematic cross-section view of an exemplary semiconductor structure consistent with various embodiments of the present disclosure.

Referring to FIG. 8, the semiconductor structure may include a substrate and a plurality of gate structures 110 formed on the substrate. Although the semiconductor structure may include a plurality of gate structures 110, only one gate structure 110 is shown in FIG. 8 to illustrate the semiconductor structure consistent with various embodiments of the present disclosure. Each gate structure 110 may include a first side I, and a second side II opposite to the first side I. Moreover, corresponding to each gate structure 110, the semiconductor structure may further include a first doped region formed in the portion of the substrate on the first side I of the gate structure 110 and a second doped region formed in the portion of the substrate on the second side II of the gate structure 110. The first doped region may contain first doping ions and the second doped region may contain second doping ions. Moreover, the ion concentration of the second doping ions in the second doped region may be smaller than the ion concentration of the first doping ions in the first doped region, and the atomic weight of the second doping ions may be smaller than the atomic weight of the first doping ions.

In one embodiment, the first doped region and the second doped region may be used to form an NMOS transistor. Accordingly, the first doping ions may be arsenic ions and/or antimony ions, and the second doping ions may be phosphorus ions. In other embodiments, the first doped region and the second doped region may be used to form a PMOS transistor. Accordingly, the first doping ions may be indium ions and/or thallium ions, and the second doping ions may be boron ions and/or $BF_2^+$ ions.

In one embodiment, the first doped region may include a drain extension region 111 formed in the portion of the substrate on the first side I of the gate structure 110, and a drain region 121 formed in the drain extension region 111 and the portion of the substrate on the first side I of the gate structure 110. The distance from the drain region 121 to the center line of the gate structure 110 along the direction of the channel may be larger than the distance from the drain extension region 111 to the center line of the gate structure 110 along the direction of the channel.

Moreover, the second doped region may include a source extension region 112 formed in the portion of the substrate on the second side II of the gate structure 110, and a source region 122 formed in the source extension region 112 and the portion of the substrate on the second side II of the gate structure 110. The distance from the source region 122 to the center line of the gate structure 110 along the direction of the channel may be larger than the distance from the source extension region 112 to the center line of the gate structure 110 along the direction of the channel.

In one embodiment, the first doping ions may be arsenic ions and/or antimony ions, and the second doping ions may be phosphorus ions.

In one embodiment, the ion concentration of the first doping ions in the drain extension region 111 may be in a range of approximately 1E15 atoms/cm$^2$ to 5E15 atoms/cm$^2$, and the ion concentration of the second doping ions in the source extension region 112 may be in a range of approximately 1E13 atoms/cm$^2$ to 1E15 atoms/cm$^2$.

In one embodiment, the semiconductor structure may also include a halo region formed in the portion of the substrate on the second side II of the gate structure 110. The halo region may contain halo-region doping ions. The doping type of the halo-region doping ions may be different from the doping type of the second doping ions.

The semiconductor structure shown in FIG. 8 may be formed by the fabrication method described above.

According to the disclosed semiconductor structures, the ion concentration of the first doping ions is larger than the ion concentration of the second doping ions, and the atomic weight of the first doping ions is larger than the atomic weight of the second doping ions. With the ion concentration of the first doping ions larger than the ion concentration of the second doping ions, the on resistance of the formed semiconductor structure may be reduced. In addition, with the atomic weight of the first doping ions relatively large, the first doping ions may not be able to diffuse easily. Therefore, the number of first doping ions diffused into the channel of the formed transistor may be reduced. As such, the SCE may be suppressed and the source-drain punching through may be avoided. In the meantime, because diffusion of the first doping ions is weak, the contact area between the first doped region and the gate structure may be small. Therefore, the overlapping capacitance between the first doped region and the gate structure may be reduced, and thus the leakage current may also be reduced. As such, the performance of the formed semiconductor structure may be improved.

Compared to conventional semiconductor structures and fabrication methods, the disclosed semiconductor structures and fabrication methods may demonstrate several advantages.

According to the disclosed method for fabricating semiconductor structures, the ion concentration of the first doping ions is larger than the ion concentration of the second doping ions, and the atomic weight of the first doping ions is also larger than the atomic weight of the second doping ions. With the ion concentration of the first doping ions larger than the ion concentration of the second doping ions, the on resistance of the formed semiconductor structure may be reduced. In addition, with the atomic weight of the first doping ions relatively large, the first doping ions may not be able to diffuse easily. Therefore, the number of first doping ions diffused into the channel of the formed transistor may be reduced. As such, the SCE may be suppressed and the source-drain punching through may be avoided. In the meantime, because diffusion of the first doping ions is weak, the contact area between the first doped region and the gate structure may be small. Therefore, the overlapping capacitance between the first doped region and the gate structure may be reduced, and thus the leakage current may also be reduced. As such, the performance of the formed semiconductor structure may be improved.

Further, prior to forming the source region, a halo region is formed in the substrate on the second side of the gate structure. The halo-region doping ions are able to recombine with the second doping ions, thus preventing the second doping ions from diffusing into the channel of the formed transistor. Therefore, the leakage current may be reduced, and the performance of the formed semiconductor structure may be improved.

According to the disclosed semiconductor structures, the ion concentration of the first doping ions is larger than the ion concentration of the second doping ions, and the atomic weight of the first doping ions is larger than the atomic weight of the second doping ions. With the ion concentration of the first doping ions larger than the ion concentration of the second doping ions, the on resistance of the formed semiconductor structure may be reduced. In addition, with the atomic weight of the first doping ions relatively large, the first doping ions may not be able to diffuse easily. Therefore, the number of first doping ions diffused into the channel of the formed transistor may be reduced. As such, the SCE may be suppressed and the source-drain punching through may be avoided. In the meantime, because diffusion of the first doping ions is weak, the contact area between the first doped region and the gate structure may be small. Therefore, the overlapping capacitance between the first doped region and the gate structure may be reduced, and thus the leakage current may also be reduced. As such, the performance of the formed semiconductor structure may be improved.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a semiconductor structure, comprising:

providing a substrate;

forming a plurality of gate structures, each including a first side and a second side opposite to the first side;

forming a first doped region containing first doping ions in a portion of the substrate on the first side of each gate structure;

forming a second doped region containing second doping ions in a portion of the substrate on the second side of each gate structure, wherein:

an ion concentration of the second doping ions in the second doped region is smaller than an ion concentration of the first doping ions in the first doped region; and an atomic weight of the second doping ions is smaller than an atomic weight of the first doping ions; and forming a halo region in the substrate on the second side of the gate structures, the halo region covering a sidewall of the second doped region closer to each gate structure.

2. The method for fabricating the semiconductor structure according to claim 1, further including:
   using the first doped region and the second doped region to form an N-type metal-oxide-semiconductor (NMOS) transistor, wherein:
   the first doping ions are arsenic ions or antimony ions; and
   the second doping ions are phosphorus ions.

3. The method for fabricating the semiconductor structure according to claim 1, further including:
   using the first doped region and the second doped region to form a P-type metal-oxide-semiconductor (PMOS) transistor, wherein:
   the first doping ions are indium ions or thallium ions; and
   the second doping ions are boron ions or $BF_2^+$ ions.

4. The method for fabricating the semiconductor structure according to claim 1, wherein:
   the first doped region includes a drain extension region formed in the substrate on the first side of the gate structure, and a drain region formed in the drain extension region and the substrate, on the first side of the gate structure, wherein a distance from the drain region to a center line of the gate structure along a direction of a channel is larger than a distance from the drain extension region to the center line of the gate structure along the direction of the channel; and
   the second doped region includes a source extension region formed in the substrate on the second side of the gate structure, and a source region formed in the source extension region and the substrate, on the second side of the gate structure, wherein a distance from the source region to the center line of the gate structure along the direction of the channel is larger than a distance from the source extension region to the center line of the gate structure along the direction of the channel.

5. The method for fabricating the semiconductor structure according to claim 4, wherein forming the first doped region and the second doped region includes:
   forming the drain extension region in the substrate on the first side of the gate structure through a lightly drain-doping process;
   forming the source extension region in the substrate on the second side of the gate structure through a lightly source-doping process;
   forming the sidewall spacer on each side surface of the gate structure after forming the drain extension region and the source extension region;
   forming the drain region in the drain extension region and the substrate on the first side of the gate structure through a drain doping process; and
   forming the source region in the source extension region and the substrate on the second side of the gate structure through a source doping process.

6. The method for fabricating the semiconductor structure according to claim 5, wherein:
   doping ions used in the lightly drain-doping process are the first doping ions; and
   doping ions used in the lightly source-doping process are the second doping ions.

7. The method for fabricating the semiconductor structure according to claim 5, wherein:
   doping ions used in the drain doping process are drain doping ions; and
   doping ions used in the source doping process are source doping ions, wherein:
   the drain doping ions and the first doping ions have a same doping type;
   the source doping ions and the second doping ions have a same doping type; and
   the source doping ions and the drain doping ions have a same ion concentration and the source doping ions and the drain doping ions are same doping ions, or an ion concentration of the drain doping ions is larger than an ion concentration of the source doping ions and an atomic weight of the drain doping ions is larger than an atomic weight of the source doping ions.

8. The method for fabricating the semiconductor structure according to claim 5, prior to forming the source region, further including:
   implanting halo-region doping ions into the substrate on the second side of the gate structure to form the halo region, wherein a doping type of the halo-region doping ions is opposite to a doping type of the second doping ions, and the halo region covers a sidewall of the source extension region closer to each gate structure and a sidewall of the source region closer to each gate structure.

9. The method for fabricating the semiconductor structure according to claim 8, wherein:
   the halo-region doping ions are boron ions or $BF_2^+$ ions; and
   process parameters for implanting the halo-region doping ions include an implantation dose in a range of approximately 5E12 atoms/cm$^2$ to 1.5E13 atoms/cm$^2$, and an implantation energy in a range of approximately 18 keV to 22 keV.

10. The method for fabricating the semiconductor structure according to claim 5, wherein:
    doping ions used in the drain doping process are first doping ions; and
    doping ions used in the source doping process are second doping ions.

11. A method for fabricating a semiconductor structure, comprising:
    providing a substrate;
    forming a plurality of gate structures, each including a first side and a second side opposite to the first side;
    forming a first doped region containing first doping ions in a portion of the substrate on the first side of each gate structure; and
    forming a second doped region containing second doping ions in a portion of the substrate on the second side of each gate structure, wherein:
    an ion concentration of the second doping ions in the second doped region is smaller than an ion concentration of the first doping ions in the first doped region; and
    an atomic weight of the second doping ions is smaller than an atomic weight of the first doping ions, wherein:
    the first doped region includes a drain extension region formed in the substrate on the first side of the gate structure, and a drain region formed in the drain extension region and the substrate, on the first side of the gate structure, wherein a distance from the drain region to a center line of the gate structure along a direction of a channel is larger than a distance from the drain extension region to the center line of the gate structure along the direction of the channel;
    the second doped region includes a source extension region formed in the substrate on the second side of the gate structure, and a source region formed in the source extension region and the substrate, on the second side of the gate structure, wherein a distance from the source region to the center line of the gate structure along the direction of the channel is larger than a distance from the source extension region to the center line of the gate structure along the direction of the channel;

forming the first doped region and the second doped region includes:
    forming the drain extension region in the substrate on the first side of the gate structure through a lightly drain-doping process;
    forming the source extension region in the substrate on the second side of the gate structure through a lightly source-doping process;
    forming the sidewall spacer on each side surface of the gate structure after forming the drain extension region and the source extension region;
    forming the drain region in the drain extension region and the substrate on the first side of the gate structure through a drain doping process; and
    forming the source region in the source extension region and the substrate on the second side of the gate structure through a source doping process;

doping ions used in the lightly drain-doping process are the first doping ions and doping ions used in the lightly source-doping process are the second doping ions;

forming the drain extension region includes forming a first patterned layer on the substrate on the second side of the gate structure, and implanting first doping ions into the substrate on the first side of the gate structure using the first patterned layer as a mask to form the drain extension region; and forming the source extension region includes forming a second patterned layer on the substrate on the first side of the gate structure, and implanting second doping ions into the substrate on the second side of the gate structure using the second patterned layer as a mask to form the source extension region.

12. The method for fabricating the semiconductor structure according to claim 11, wherein:
    the first doping ions are arsenic ions or antimony ions;
    process parameters for implanting the first doping ions include an implantation dose in a range of approximately 1E15 atoms/cm$^2$ to 5E15 atoms/cm$^2$, and an implantation energy in a range of approximately 3 keV to 5 keV;
    the second doping ions are phosphorus ions; and
    process parameters used to implant the second doping ions include an implantation dose in a range of approximately 1E13 atoms/cm$^2$ to 1E15 atoms/cm$^2$, and an implantation energy in a range of approximately 10 keV to 30 keV.

13. A semiconductor structure, comprising:
    a substrate;
    a plurality of gate structures formed on the substrate, each including a first side and a second side opposite to the first side;
    a first doped region containing first doping ions in a portion of the substrate on the first side of each gate structure;
    a second doped region containing second doping ions in a portion of the substrate on the second side of each gate structure, wherein:
        an ion concentration of the second doping ions in the second doped region is smaller than an ion concentration of the first doping ions in the first doped region; and
        an atomic weight of the second doping ions is smaller than an atomic weight of the first doping ions; and
    a halo region in the substrate on the second side of the gate structures, the halo region covering a sidewall of the second doped region closer to each gate structure.

14. The semiconductor structure according to claim 13, wherein:
    the first doped region and the second doped region are used to form an NMOS transistor;
    the first doping ions are arsenic ions or antimony ions; and
    the second doping ions are phosphorus ions.

15. The semiconductor structure according to claim 13, wherein:
    the first doped region and the second doped region are used to form a P-type metal-oxide-semiconductor (PMOS) transistor;
    the first doping ions are indium ions or thallium ions; and
    the second doping ions are boron ions or $BF_2^+$ ions.

16. The semiconductor structure according to claim 13, wherein:
    the first doped region includes a drain extension region formed in the substrate on the first side of the gate structure, and a drain region formed in the drain extension region and the substrate on the first side of the gate structure, wherein a distance from the drain region to a center line of the gate structure along a direction of a channel is larger than a distance from the drain extension region to the center line of the gate structure along the direction of the channel;
    the second doped region includes a source extension region formed in the substrate on the second side of the gate structure, and a source region formed in the source extension region and the substrate on the second side of the gate structure, wherein a distance from the source region to the center line of the gate structure along the direction of the channel is larger than a distance from the source extension region to the center line of the gate structure along the direction of the channel;
    the drain extension region contains the first doping ions; and
    the source extension region contains the second doping ions.

17. The semiconductor structure according to claim 16, wherein:
    the first doping ions are arsenic ions or antimony ions;
    the second doping ions are phosphorus ions;
    an ion concentration of the first doping ions in the drain extension region is in a range of approximately 1E15 atoms/cm$^2$ to 5E15 atoms/cm$^2$; and
    an ion concentration of the second doping ions in the source extension region is in a range of approximately 1E13 atoms/cm$^2$ to 1E15 atoms/cm$^2$.

18. The semiconductor structure according to claim 16, wherein:
    the drain region contains the first doping ions; and
    the source region contains the second doping ions.

19. The semiconductor structure according to claim 13, wherein:
    the halo region contains halo-region doping ions; and
    a doping type of the halo-region doping ions is opposite to a doping type of the second doping ions.

20. The semiconductor structure according to claim 19, wherein:
    the halo-region doping ions are boron ions or $BF_2^+$ ions; and
    an ion concentration of the halo-region doping ions in the halo region is in a range of approximately 5E12 atoms/cm$^2$ to 1.5E13 atoms/cm$^2$.

* * * * *